United States Patent
Paré, Jr. et al.

(10) Patent No.: US 6,711,598 B1
(45) Date of Patent: Mar. 23, 2004

(54) METHOD AND SYSTEM FOR DESIGN AND IMPLEMENTATION OF FIXED-POINT FILTERS FOR CONTROL AND SIGNAL PROCESSING

(75) Inventors: Thomas E. Paré, Jr., Mountain View, CA (US); Daniel Joseph Hernandez, San Jose, CA (US); Cecilia Gabriela Galarza, San Francisco, CA (US); Mark Alan Erickson, San Bruno, CA (US); Sunil C. Shah, Los Altos, CA (US)

(73) Assignee: Tokyo Electron Limited, Tokyo (JP)

( * ) Notice: Subject to any disclaimer, the term of this patent is extended or adjusted under 35 U.S.C. 154(b) by 558 days.

(21) Appl. No.: 09/710,410

(22) Filed: Nov. 10, 2000

Related U.S. Application Data

(60) Provisional application No. 60/164,974, filed on Nov. 11, 1999.

(51) Int. Cl.[7] .............................................. G06F 17/10
(52) U.S. Cl. ....................................................... 708/300
(58) Field of Search ................................... 708/300, 301, 708/322; 716/1, 4, 18

(56) References Cited

U.S. PATENT DOCUMENTS

| 5,724,239 A | 3/1998 | Kaneko |
| 5,928,311 A | 7/1999 | Leavy et al. |

Primary Examiner—Chuong Dinh Ngo
(74) Attorney, Agent, or Firm—Blakely, Sokoloff, Taylor & Zafman LLP

(57) ABSTRACT

A method and system is disclosed for design and implementation of fixed-point filters from floating-point filters. A design sequence for designing a fixed-point filter for a system is selected. A low-order floating-point filter and a first set of parameters associated with the low-order floating-point filter components are then selected. One or more parameters of the first set of parameters is then iteratively modified to obtain a set of modified parameters, until a plurality of performance characteristics calculated using the first set of parameters meets a performance objective for the fixed-point filter for the system.

12 Claims, 8 Drawing Sheets

| Decisions and Costs Associated with Blocks in Methods Flow Diagram of FIG. 3 ||
|---|---|
| Decisions: | Costs: |
| Block 210: Fixed-Order Control Design | |
| 1. Aggressiveness of desired closed-loop transfer function? | a. Performance<br>b. Robustness<br>c. Computation time during design |
| 2. Technique and order used to fit desired closed-loop transfer function? (required if desired closed-loop response is not given as a transfer function) | a. Accuracy of fit → performance<br>b. Computation time during design |
| 3. Range of orders of controllers that give the best approximations to the desired closed-loop transfer function in some sense (e.g., H-infinity or $H_2$ norms)? | a. Performance<br>b. Robustness<br>c. Computation time during design<br>d. Real-time computational resources (e.g., computation time and memory) |
| 4. Selection of order with best performance/robustness/ real-time computational resources trade offs? | a. Performance<br>b. Robustness<br>c. Real-time computational resources (e.g., computation time and memory) |
| 5. Tolerances used in LMI solutions? | a. Accuracy of solution → performance and robustness<br>b. Computation time during design |
| 6. Use of identification-based model uncertainties? | a. Robustness<br>b. Performance<br>c. Computation time during design |
| Block 225: Conventional Control Design | a. Performance<br>b. Robustness |
| 1. Technique used to design controller? | c. Controller size → controller size after model reduction → real-time resources<br>d. Computation time during design |
| 2. Aggressiveness of controller design? | a. Performance<br>b. Robustness<br>c. Controller size → controller size after model reduction → real-time resources<br>d. Computation time during design |
| 3. Use of identification-based model uncertainties? | a. Robustness<br>b. Performance<br>c. Computation time during design |

| Block 235: Controller Reduction | |
|---|---|
| 1. Technique used to do controller reduction? | a. Accuracy of reduction → performance and robustness<br>b. Computation time during design time (includes time to do a reduction and consistency of method) |
| 2. Order of reduced controller? | a. Accuracy of reduction → performance and robustness<br>b. Computation time during design (depends on likelihood of performance of reduced order controller being acceptable) |
| 3. Selection of frequency weight? | a. Accuracy of reduction → performance and robustness<br>b. Computation time during design time |
| Block 310: Check Performance of Floating-Point Controller on High Order Linear Model vs. Filter Size | |
| 1. Technique used to check performance? | a. Applicability of test (how much confidence does it inspire?)<br>b. Computation time during design time |
| 2. Is trade-off between performance degradation and controller size acceptable? | a. Accuracy of reduction → performance and robustness<br>b. Controller size → controller size after model reduction → real time resources |
| Block 320: Check Performance of Floating-Point Controller on Full Nonlinear Model vs. Controller Size | |
| 1. Technique used to check performance? | a. Applicability of test (how much confidence does it inspire?)<br>b. Computation time during design time |

| | |
|---|---|
| 2. Is trade-off between performance degradation and controller size acceptable? | a. Accuracy of reduction→performance and robustness<br>b. Controller size→controller size after model reduction→real time resources |
| Block 410: Map Into Implementation Structure<br><br>1. Choice of implementation structure | a. Real-time computational efficiency<br>b. Minimization of inaccuracies in controller with quantized coefficients<br>c. Minimization of signal quantization<br>d. Minimization of probability of saturation |
| 2. Method of mapping coefficients? | a. Minimization of inaccuracies in controller with quantized coefficients<br>b. Minimization of signal quantization<br>c. Minimization of probability of saturation |
| Block 420: Check Floating-Point Implementation with Quantized Coefficients<br><br>1. Technique used to check accuracy or performance? | a. Applicability of test (how much confidence does it inspire?)<br>b. Computation time during design time |
| 2. Is trade-off between accuracy or performance and real-time computational efficiency acceptable? | a. Real-time computational efficiency<br>b. Minimization of inaccuracies in controller with quantized coefficients<br>c. Minimization of signal quantization<br>d. Minimization of probability of saturation |
| Block 430: Choose Initial Implementation Parameters<br><br>1. Choices of coefficient scalings? | a. Minimization of signal quantization→performance<br>b. Minimization of inaccuracies in controller with quantized coefficients<br>c. Minimization of probability of signal saturation |
| 2. Choices of signal scalings? | a. Minimization of signal quantization→performance<br>b. Minimization of probability of signal saturation |

| | |
|---|---|
| Block 510: Check Performance of Fixed-Point Controller on High Order Linear Model<br><br>1. Use target hardware in simulation or experiment if target hardware is ready?<br><br>2. Technique used to check accuracy or performance?<br><br><br>3. Is trade-off between performance and real-time computational efficiency acceptable? | a. Time required to run test<br>b. Applicability of test (How much confidence does it inspire?)<br><br>a. Applicability of test (how much confidence does it inspire?)<br>b. Computation time during design time saturation<br><br>a. Minimization of signal quantization → performance<br>b. Minimization of probability of signal saturation<br>c. Real-time computational efficiency (depends, for example, upon implementation structure and number of scalings) |
| Block 440: Adjust Implementation Paramenters<br><br>1. Choices of coefficient scalings?<br><br><br><br>2. Choices of signal scalings? | a. Minimization of signal quantization → performance<br>b. Minimization of inaccuracies in controller with quantized coefficients<br>c. Minimization of probability of signal saturation<br><br>a. Minimization of signal quantization → performance<br>b. Minimization of probability of signal saturation |
| Block 520: Check Performance of Fixed-Point Controller on Full Nonlinear Model<br><br>1. Use target hardware in simulation or experiment if target hardware is ready?<br><br>2. Technique used to check accuracy or performance?<br><br><br>3. Is trade-off between performance and real-time computational efficiency acceptable? | a. Time required to run test<br>b. Applicability of test (how much confidence does it inspire?)<br><br>a. Applicability of test (how much confidence does it inspire?)<br>b. Computation time during design time<br><br>a. Minimization of signal quantization → performance<br>b. Minimization of probability of signal saturation<br>c. Real-time computational efficiency (depends, for example, upon implementation structure and number of scalings) |

METHOD AND SYSTEM FOR DESIGN AND IMPLEMENTATION OF FIXED-POINT FILTERS FOR CONTROL AND SIGNAL PROCESSING

This application claims the benefit of the filing date of the following Provisional U.S. Patent Application: "FIXED-POINT CONTROLLER IMPLEMENTATION", application No. 60/164,974, filed on Nov. 11, 1999.

BACKGROUND OF THE INVENTION

1. Field of the Invention

The present invention relates generally to control design methodology and, more particularly, to a method for integrating and automating the implementation of fixed-point filter designs.

2. Description of Related Art

Discrete-time filters are ubiquitous in digital electronics since they are used in almost all sampled-data systems. For example, discrete-time filters are used in disk drives, automobiles, cellular phones, stereos, and modems, to name a few applications. Some of these filters are used as components in feedback control systems, in which case they are commonly referred to as controllers.

A number of techniques and tools exist for designing discrete-time filters and controllers that are based on modern control and signal processing theory. Design tools often produce controllers or filters that are represented by a large set of coefficients having very high precision (e.g., 32- or 64-bit floating-point precision).

If the filter is to be implemented in real time on a floating-point processor, it may be necessary to reduce the number of coefficients used to represent the filter by approximating it with fewer coefficients in order to reduce the number of computations necessary between samples. If the filter is to be implemented on a fixed-point processor, then the coefficients of the filter must be represented as integers and the computations must be carried out using integer arithmetic. To avoid saturation and loss of precision in the filter, the coefficients must be scaled properly.

Fixed-point implementation of filter designs, especially high-order filter designs, can be a very nonsystematic and time-consuming, thus making their implementation an expensive task. Currently, no single software tool is available that can be used for the entire process of fixed-point implementation of filter designs. Because certain steps within the filter design process have unpredictable outcomes, the process tends to be iterative and requires the filter designer to perform a large number of manual operations. In addition, existing filter design implementation tools are created specifically for designers who have a high level of expertise, and are not useful for engineers with a more general background.

One shortcoming of existing filter design implementation tools and methodologies is the lack of an automated and integrated way to efficiently group coefficient or signal scalings. A filter designer must manually select ("lock") individual scalings associated with coefficients or signals and then expect the design tool to choose different values for each of the remaining scalings, which often proves to be a difficult task. A typical example of such a software tool is Simulink Fixed-Point Blockset, available from Mathworks, Inc. of Natick, Mass. The use of this tool is a labor-intensive effort and often results in a computationally inefficient filter implementation.

Another shortcoming of current filter design implementation tools is in their method of performing model reduction (i.e., reducing the size of the filter). These methods are not automated and, require significant knowledge in the art of signal processing and control engineering. Further, in some control systems the filter that forms the feedback controller is open-loop unstable. Standard model reduction tools cannot be applied to unstable filters. Two examples of such software tools are MATLAB® Control System Toolbox (available from Mathworks, Inc. of Natick, Mass.) and Matrixx (available from Integrated Systems, Inc. which is owned by Wind River Systems).

Finally, one significant shortcoming with existing software tools is that most of these filter design tools can perform only single, fragmented sub-tasks that are part of the fixed-point filter design implementation process. It is generally left to an expert user to manually integrate tools that perform these subtasks into a complete design process.

SUMMARY OF THE INVENTION

A method and system is disclosed for design an implementation of fixed-point filters from floating-point filters. A design sequence for designing a fixed-point filter for a system is selected. A low-order floating-point filter and a first set of parameters associated with the low-order floating-point filter components are then selected. One or more parameters of the first set of parameters is then iteratively modified to obtain a set of modified parameters, until a plurality of performance characteristics calculated using the first set of parameters meets a performance objective for the fixed-point filter for the system.

BRIEF DESCRIPTION OF THE DRAWINGS

FIG. 4 illustrates decisions and costs associated with the blocks of the flowchart of FIG. 3.

DETAILED DESCRIPTION OF THE INVENTION

Figure 1A:
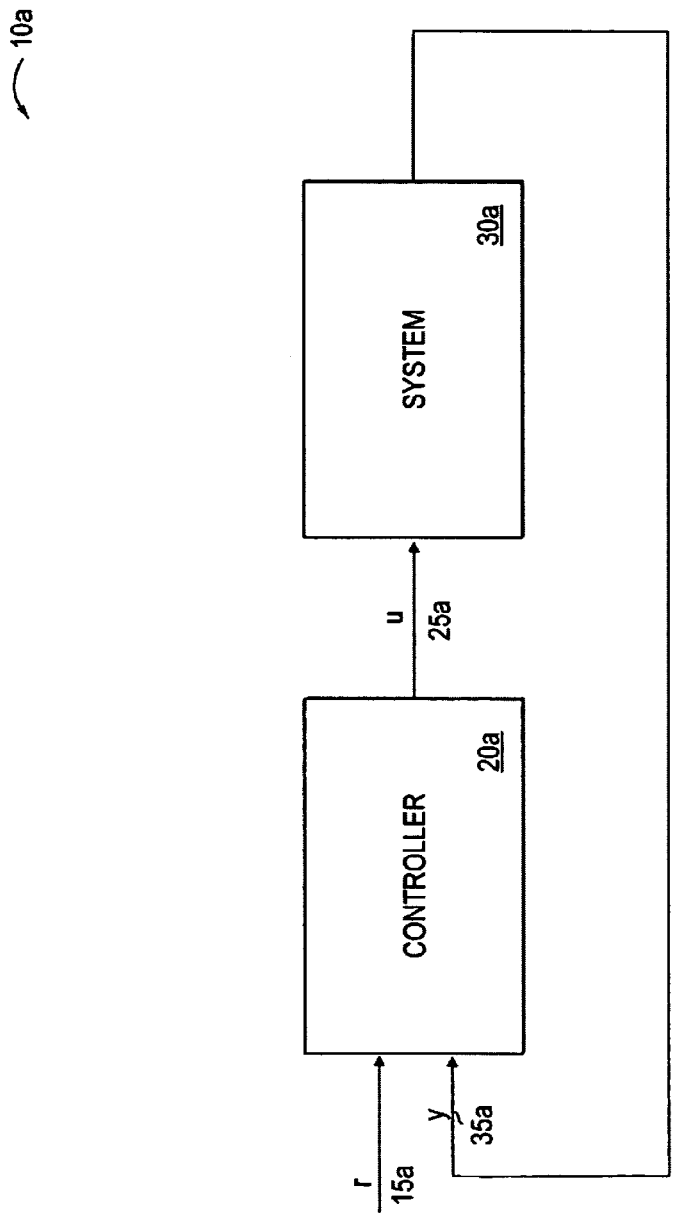
FIG. 1a illustrates an exemplary embodiment of a closed loop control system architecture.

A method and system to produce a fixed-point filter that is ready for real-time implementation from a high-order floating-point design is described. Upon completion of the method, the performance of the fixed-point filter approximates the performance of the floating-point filter.

The method and system of the present invention may be integrated into a single software package that allows a filter designer to quickly and easily generate a fixed-point filter design from a floating-point filter design. A decision making or advising module may also be integrated into the software package, thus augmenting the present invention. When implemented in this manner, the present invention may be carried out in an automated way, using little or no information from the user.

The present invention may also be integrated into a procedure that could be manually executed by a filter designer. When implemented in this fashion, the present invention may employ the user's knowledge to obtain better performance and/or to shorten the time required to design a fixed-point filter.

In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in block diagram form, rather than in detail, in order to avoid obscuring the present invention. These embodiments are described in sufficient detail to enable those skilled in the art to practice the invention. It is to be understood that other embodiments may be utilized and that logical, software, re-ordering of steps, and other changes may be made without departing from the scope of the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm as described here, is generally conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention can be implemented by an apparatus for performing the operations herein. This apparatus may be specially constructed for the required purposes, or it may comprise a general purpose computer, selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method. For example, any of the methods according to the present invention can be implemented in hard-wired circuitry, by programming a general purpose processor or by any combination of hardware and software. One of skill in the art will immediately appreciate that the invention can be practiced with computer system configurations other than those described below, including hand-held devices, multiprocessor systems, microprocessor-based or programmable consumer electronics, network PCs, minicomputers, mainframe computers, and the like. The invention can also be practiced in distributed computing environments where tasks are performed by remote processing devices that are linked through a communications network. The required structure for a variety of these systems will appear from the description below.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application . . . ), as taking an action or causing a result. Such expressions are merely a shorthand way of saying that execution of the software by a computer causes the processor of the computer to perform an action or produce a result.

Figure 1B:
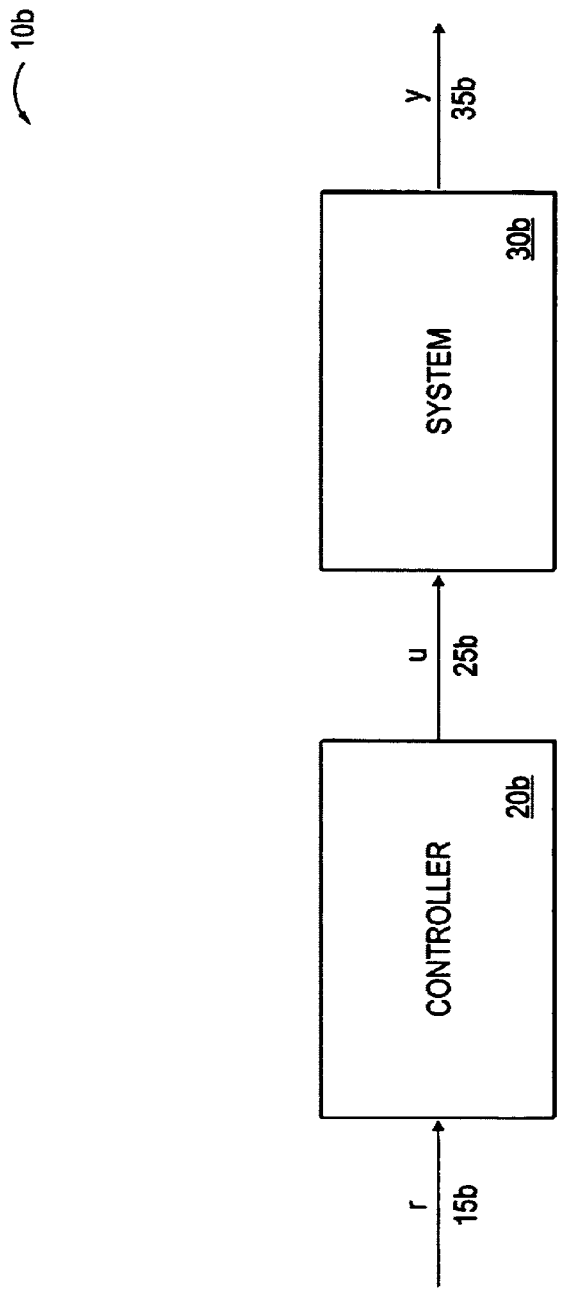
FIG. 1b illustrates an exemplary embodiment of an open loop control system architecture.

FIG. 1a illustrates an exemplary embodiment of a closed loop control system architecture 10a. In one embodiment, the present invention is described in connection with a closed loop system. Alternatively, the present invention may be implemented with open loop systems. FIG. 1b illustrates an exemplary embodiment of an open loop control system architecture 10b. For ease and convenience it should be noted that FIGS. 1a and 1b will be discussed together as FIG. 1 and the components thereof will not be labeled with "a" or "b" since the components thereof are essentially the same, but are just in a different configuration.

Referring now to FIGS. 1a and 1b (hereinafter FIG. 1), a model of a system 30 is driven by an input signal u25, generated by a filter 20. In one embodiment, the filter 20 may use the output y35 of the system 30 and a reference signal r15 to generate the input signal u. Alternatively, the filter 20 may operate without either of these signals. In one embodiment, the system 30 is a physical process, the signal u25 is a computer representation of the physical actuation of the system 30, and the signal y35 is a computer representation of physical measurements taken from the system 30. Further, the reference signal r15 is specified by a user, and the filter 20 is implemented as a computational algorithm on a computer system.

According to one embodiment, the system 30 is modeled by a linear multi-input, multi-output (MIMO) system described by:

$$x_{k+1} = Ax_k + Bu_k$$

$$y_k = Cx_k$$

where $x_k$ is a state vector, also known as memory of the system 30, $u_k$ is a vector of input signals, $y_k$ is a vector of output signals, k is a time index with k=0,1,2, . . . , and A, B, and C are matrices of appropriate dimensions. The controller or filter 20 may include a linear estimator and a constant state-feedback regulator with integral action and is described by the following formulas:

$$x'_{k+1} = Ax_k + Bu_k + L(y_k - y'_k)$$

$$y'_k = Cx'_k$$

$$u_k = K_1 x'_k + K_2 \sum_{i=0}^{k}(r_i - y_i)$$

where L, $K_1$ and $K_2$ are adjustable gain matrices and represent correction factors, and $X'_k$ and $y'_k$ represent estimates of the state vector and the vector of output signals. In an alternate embodiment, the controller is composed of several such components, with different state vectors and parameter matrices, each for a different range of y. Such controller components are called local controllers. In one embodiment, the adjustable regulator gain matrices $K_1$ and $K_2$ may be computed using linear-quadratic optimization methods from a first set of design parameters $$P = \{R_r, Q_r | R_r > 0, Q_r \geq 0\}$$

where each element of the set of design parameters represents a full parameter matrix of suitable dimensions. In one embodiment, the first set of parameters P includes a large number of parameters. Similarly, the adjustable gain matrix L may also include a large number of parameters.

Alternatively, the controller of filter (10) may be of the form $$Z_{k+1} = Fz_k + G_1 r_k + G_2 y_k$$

$$u_k = Hz_k + D_1 r_k + D_2 y_k$$

where F, $G_1$, $G_2$, H, $D_1$, $D_2$ may be computed using any design method. Almost every linear time invertant filter can be represented in this format (including those formulas previously discussed).

The filter 20 is designed for a particular system, such as the system 30, so as to achieve a desired level of performance. It should be noted that the present invention applies to the subset of filters known as feedback controllers as well as filters commonly used in signal processing applications, such as equalizers, estimators, and bandpass filters (including lowpass, highpass, and bandstop filters). Feedback controllers operate on an error signal generated from a feedback signal to make the output of the system track a desired response. Depending on the type of the filter, the specific actions performed during each step of the present invention may differ, but the overall methodology still applies.

A sequence of tasks needed to complete a design of the filter for a system is called a design cycle. In one embodiment, the design cycle contains multiple feedback and feedforward paths. A decision to proceed on a particular path is taken based on the status of the design at a particular point in time. Alternatively, the design cycle may be performed without multiple feedback and feedforward paths.

In one embodiment, the designer (or user of the design cycle) has the sole task of selecting the design strategy. Alternatively, in selecting a design strategy, the designer may use a real-time planner. An example of a real-time planner is described in U.S. patent application Ser. No. 09/345,172, filed Jun. 30, 1999, entitled "Real-Time Planner for Design", to Sunil C. Shah, Pradeep Pandey, Thorkell Gudmundsson, and Mark Erickson, and assigned to the assignee herein. An example of a design cycle is described in further detail below.

Figure 2:
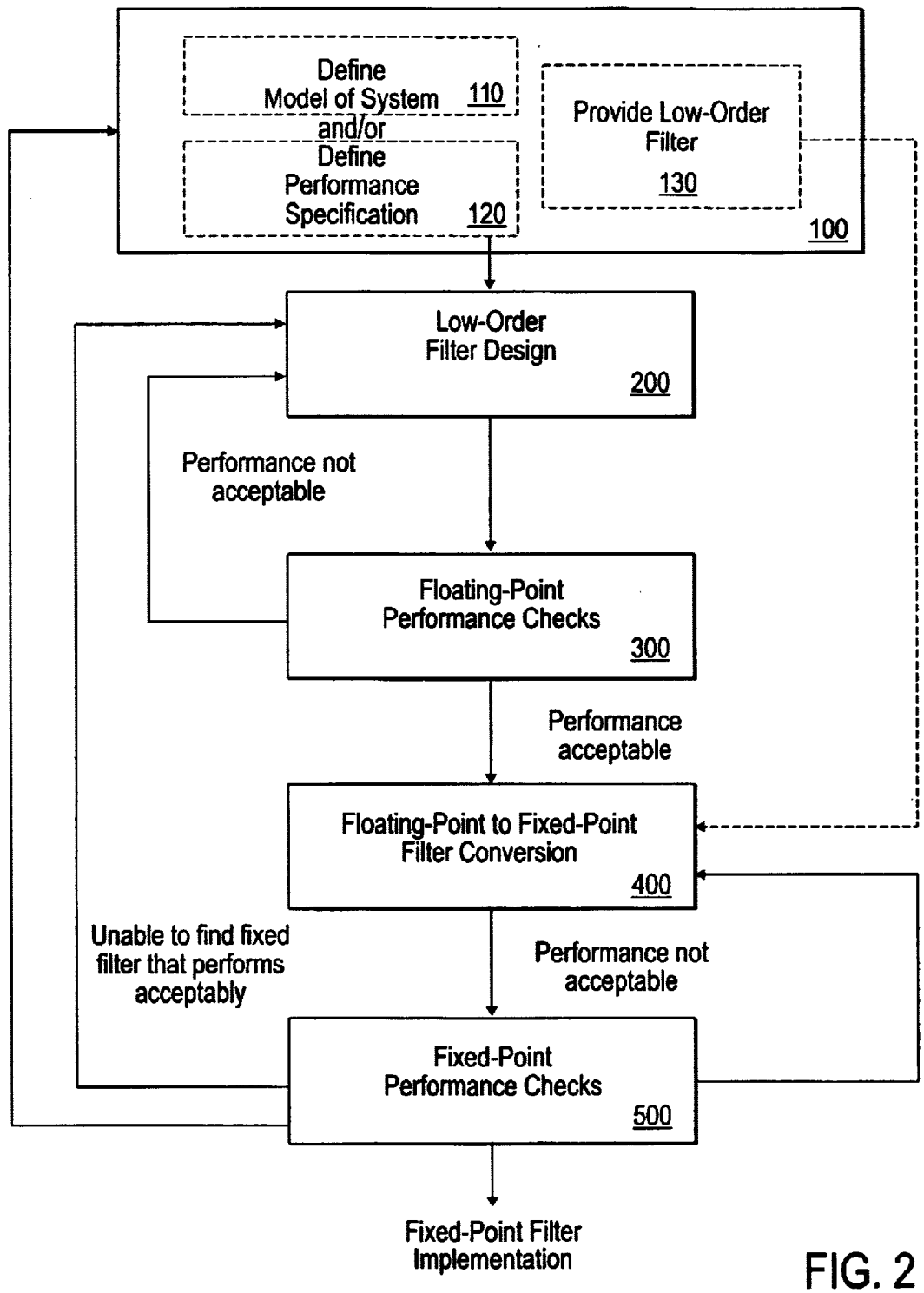
FIG. 2 illustrates a flowchart of one embodiment of the fixed-point filter design process of the present invention.

FIG. 2 illustrates an example of a design cycle for producing a fixed-point filter from a floating-point filter of one embodiment of the present invention. As shown in FIG. 2, the design cycle starts at "Start block" 100. In one embodiment, a model 110 of the system 30 is defined and/or a performance specification 120 is defined, at Start block 100. The model 110 of the system 30 may or may not be a high-order model. The set of performance (or robustness) specifications 120 are defined as the particular characteristics that the filter 20 must meet in order to reach the user's desired goals. Performance goals may include, for example steady-state and transient tracking performance for a feedback control system. For an equalizer, mean-squared error criterion may be used. For feedback control systems robust measures are well known. The performance specifications 120 (or characteristics) may include performance specifications of the filter 20 itself or specifications of the filter 20 and the system 30.

It should be noted that in other embodiments, the fixed-point filter design cycle Start block 100 may include either just defining Model 110 of System or just defining Filter Performance Specifications 120 or both. Thus, combining steps 110 and 120 is not required to practice the present invention.

In another embodiment, the user may start by selecting a low-order filter 130 that is used to define the performance specifications (or characteristics) of the fixed-point filter. The low-order filter 130 selected may include an already designed filter that is optimal in terms of qualities such as filter order, bandpass ripple, bandstop attenuation, and rate of roll-off. In this configuration, the user may skip to block 200 (Low-Order Filter Design) and block 300 (Floating-Point Performance Checks) of the present invention.

Continuing with reference to FIG. 2, at block 200, a low-order floating-point filter meeting the defined performance specifications is designed (Low-Order Filter Design). In one embodiment, if the user is starting with a high-order model 110, block 200 includes the design of a high-order filter followed by filter reduction (i.e., making the filter more compact, yet still preserving its performance).

In another embodiment the user may first reduce the size of the model 110 (done as part of Start block 100) and then perform a low-order filter design on the reduced model of the system (as part of block 200). This approach allows the user to skip the iterative filter reduction sub-step discussed in greater detail below.

In yet another embodiment, the user may design a fixed-order low-order filter that meets the performance specifications 120. In this configuration, the method of this invention allows the user to skip the filter reduction sub-step discussed in greater detail below.

Referring back to FIG. 2, the next block of the present invention is performing Floating-Point Performance Checks (block 300). In block 300, the performance of the low-order filter design developed in block 200 is verified against the performance specifications 120 provided in block 100. If the specifications are not met, the filter may be redesigned (done at block 200).

If a low-order filter 130 meeting the specifications was provided by the user as part of block 100, the method will proceed to block 400.

Continuing with reference to FIG. 2, in the next block 400 Floating-Point to Fixed-Point Filter Conversion is performed. As part of block 400, the low-order floating-point filter obtained in block 200 (with its floating-point performance checks completed in block 300) or the low-order filter 130 provided by the user in block 100 is cast into a filter implementation structure. Next, the coefficient and signal scalings for the fixed-point implementation of the filter are determined.

Referring again to FIG. 2, at block 500 Fixed-Point Performance Checks are performed. As part of block 500, the performance of the fixed-point filter (from block 400) is verified against the performance specifications 120 provided in block 100. The fixed-point performance checks of block 500 may be performed through analytical calculations, software simulations, simulations interfaced with the target hardware, or from experimental data obtained through an interface with the target hardware or device. If the filter (and/or model of the system) specifications are not met, then the method may return to block 400 to redesign the fixed-point implementation of the filter. Alternatively, the method may return to block 200 to redo the model/filter reduction or to redesign the low-order floating-point filter. If the method is implemented in a software environment and the method collects information obtained from the various steps, the method may also alert the user that it is unlikely that the method will succeed for the given inputs. Such a decision making process may be augmented by the inclusion of a Real-Time Planner for Design module (referred to above).

Figure 3:
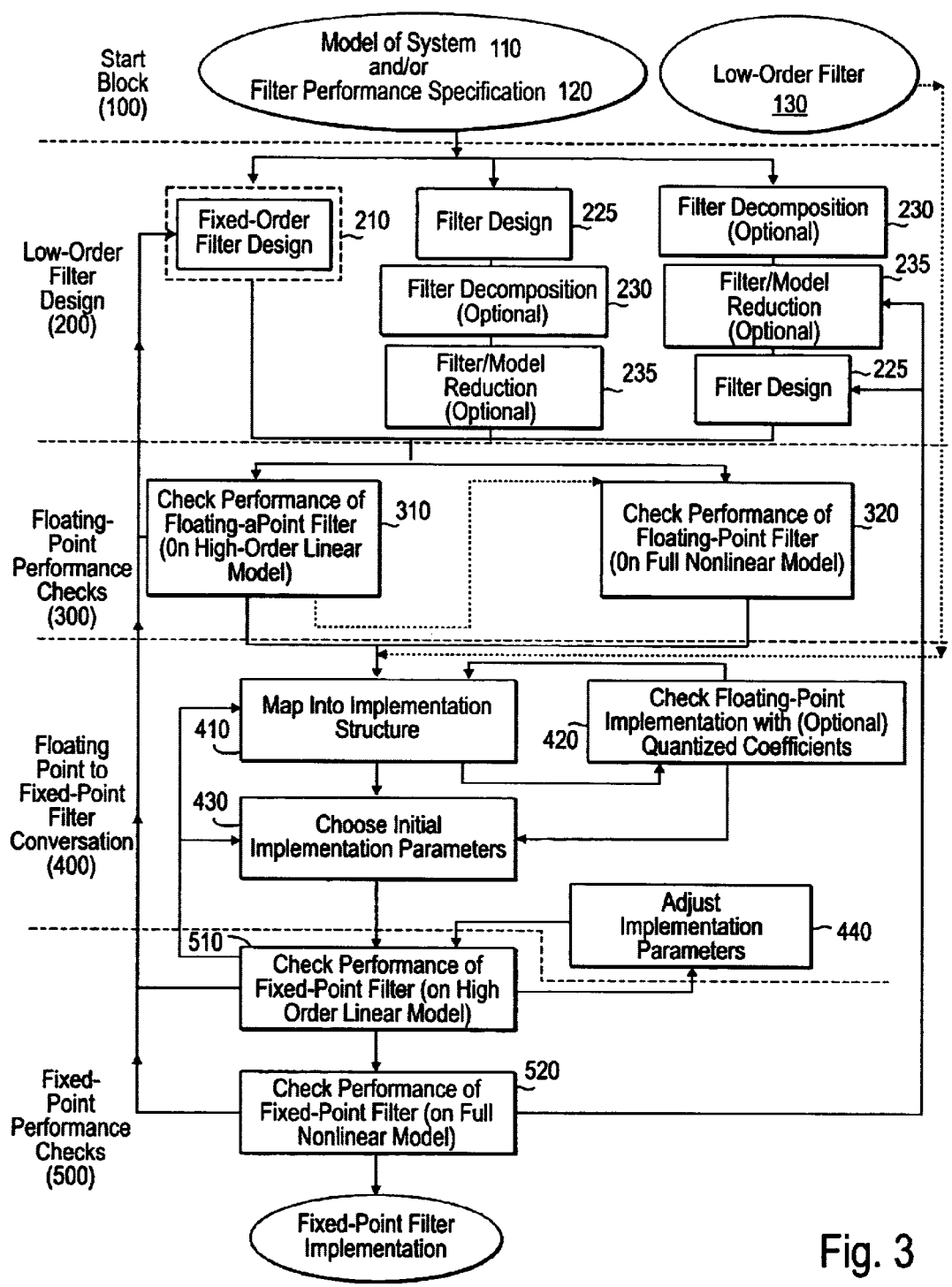
FIG. 3 illustrates a flowchart of another embodiment of an integrated and automated fixed-point filter/controller implementation design of the present invention.

Turning to FIG. 3, a flowchart of another embodiment of an integrated and automated fixed-point filter/controller implementation design of the present invention is illustrated. For reference the five blocks outlined in FIG. 2 along with more detailed sub-steps of the present invention are shown. As stated previously, in addition to the Start block 100, the other major blocks include Low-Order Filter Design (block 200), Floating-Point Performance Checks (block 300), Floating-Point to Fixed-Point Filter Conversion (block 400), and Fixed-Point Performance Checks (block 500). Each of the blocks 100–500 of the method of the present invention are described in greater detail in the following paragraphs.

Block 100—Provide Filter Design Input

With reference to FIG. 3, in one embodiment, the method of the present invention starts at block 100 by obtaining a model 110 of the system 30 to which the filter 20 will be applied. If desired, a set of performance and robustness specifications 120 that the filter 20 must meet may also be identified at block 100.

The model 110 of the system 30, which is often referred to in the control design arts as the plant, may or may not be a high-order model. The model of the system may be obtained by any of the methods known in the field of signal design or signal processing. The model of the system (i.e., plant) may also include a characterization of the model uncertainty.

Continuing with reference to FIG. 3, in another embodiment, the user may begin the filter design process by providing a low-order floating-point filter 130 that is used to define the specifications 120 (block 100). For example, the input to the method may be a floating-point bandpass filter (e.g., Butterworth, Chebyshev, Elliptic, or windowed FIR) that is already optimal in terms of qualities such as filter order, bandpass ripple, bandstop attenuation, and rate of roll-off. By using this approach, blocks 200 and 300 in FIG. 3 are skipped and the method of the present invention proceeds directly to block 400, Floating-Point to Fixed-Point Filter Conversion. However, it should be noted that since blocks 200 and 300 are skipped this approach may not allow redesigning the filter to try to improve the fixed-point implementation. Thus, the user may choose different procedures to meet their particular needs.

Block 200—Low-Order Filter Design

Referring to the flowchart of FIG. 3, a low-order filter design is performed in block 200. In one embodiment of block 200, after the user obtains a model 110 of the system 30 (i.e., plant) in block 100, the user may then start designing a floating-point filter 225. If the filter is to be a controller, designing a floating-point filter may be done using such methods as $H_2$, H-infinity, or $\mu$-synthesis. If the filter is to be a bandpass filter, it may be designed using, for example, any of the filter design techniques described in A. Oppenheim and R. Schafer, *Discrete-Time Signal Processing*, Prentice Hall, 1989. If the filter is to be an equalizer, it may be designed by using optimal filtering techniques known in the art of signal processing and control systems.

If performance and/or robustness specifications 120 (or characteristics) of the fixed-point filter design are not given as inputs prior to the start of the present invention, then these specifications may be defined for the rest of the method as being slightly lower than the performance and robustness of the floating-point design 225. In this approach, the user may also be guided in this process using Bayesian networks. For an example of the use of Bayesian Networks in design, see co-pending patent application Ser. No. 09/345,172 titled "Real-Time Planner for Design," filed on Jun. 30, 1999, and assigned to the assignee herein. Alternatively, the user may provide a high-order floating-point filter that meets or defines the specifications. In this case, it may be necessary to perform model reduction 235 before continuing on to the Floating-Point Performance Check block 300.

Continuing with FIG. 3, the controller design methods mentioned above ($H_2$, H-infinity, or $\mu$-synthesis) produce controllers that are at least as large as the model. Large filters can be difficult or impossible to implement. One approach to the low-order controller synthesis problem is to first reduce the size of the model 110 of the system 30 as early as block 100 in order to obtain a low-order model 110 and then perform a low-order floating point filter design (225) on the already reduced model. This approach allows the user to skip the filter reduction sub-step 235.

In another embodiment of block 200, the user may first design the controller using a high-order model of the system (as step 225 in FIG. 3) and then perform model reduction 235.

Several methods of model reduction may be used to perform the filter/model reduction 235. For example, a frequency weighted least squares transfer function matrix fit to frequency response data could be used to generate a lower order filter. Alternatively, balanced realization and truncation, optimal Hankel norm approximation, or a frequency-weighted version of any of these methods may be used to perform the filter/model reduction 235.

Still referring to FIG. 3, since many model reduction methods do not work for unstable systems, at 230, the filter may be decomposed into stable and unstable subsystems so that model reduction 235 can be performed on only the stable subsystem. This type of filter decomposition may be achieved by putting the system in real Schur form and swapping Schur blocks to isolate the unstable modes. The system may then be decomposed into an unstable system in parallel with a stable system by solving a Sylvester equation.

Additionally, filter decomposition 230 may also be used to separate out modes that the user does not want to include in the model reduction in order to increase the accuracy of the filter reduction. These modes may, for example, correspond to an integrator or a notch filter that is explicitly designed into a controller (whereas the remaining modes may have been automatically designed into the controller using an optimal control algorithm).

A computerized real-time planner for design (referred to above) or similar system may be used to facilitate filter reduction 235 in many ways. For example, the planner could suggest model-based frequency weightings for controller reduction. The frequency weighting could be based on the formulation $$P/(1+PC)$$

where P is the model transfer function and C is the controller transfer function. The formulation presented in the above equation tends to minimize controller reduction errors near the closed-loop bandwidth.

Alternatively, the frequency weighting could be the relative error weighting, 1/C, which tends to spread out the controller reduction errors across all frequencies. Alternatively, a frequency weighting incorporating information from the model uncertainties could be used to increase robustness. For example of determining model uncertainties see as described in U.S. patent application Ser. No. 09/345, 640, filed Jun. 30, 1999, entitled "Model Error Bounds for Identification of Stochastic Models for Control Design", to Sunil Shah, and assigned to the assignee herein.

The real-time planner for design may also be used at filter/model reduction 235, to adjust the gains of the frequency weightings on the inputs and outputs of a multi-input multi-output (MIMO) controller. This may be done so that high gain channels of the controller do not cause the accuracy of low gain channels of the controller to deteriorate especially when the accuracy of the low gain channels has a significant effect on the controller performance.

With reference to FIG. 3, an alternative approach to the low-order controller synthesis of block 200 is to constrain the controller design to a fixed-order filter design 210. This approach offers the advantage of skipping the controller reduction step 235. A fixed-order controller synthesis design 210 in which the order of the controller is specified prior to its design, allows the user to generate controllers over a range of sizes and then choose the controller with the best performance-size trade-off.

Alternatively, if the maximum controller size specification has already been determined by hardware constraints, the user (as part of 210) may simply design the controller to have the maximum allowable size.

A fixed-order controller synthesis method may shape the closed-loop transfer function in order to optimally approximate a desired closed-loop transfer function in an H-infinity sense. The desired closed-loop transfer function could be specified in terms of transfer function coefficients or frequency response data, or it could be the result of a conventional controller design step. Additionally, the design can make use of identification-based model uncertainties to guarantee robust stability over the family of models defined by the combination of the model and the model uncertainties. By formulating the design using linear matrix inequalities (LMI's), the user may pre-specify the desired order of the controller in 210. It should be noted that this is merely an example and that other fixed-order methods may be used.

Block 300—Floating-Point Performance Checks

Continuing with reference to FIG. 3, after the design of a candidate low-order floating-point filter in block 200, the performance of the system using the candidate filter is checked against the specifications in block 300. If the filter is a simple lowpass filter, the performance specifications might dictate the acceptable passband ripple or the rate of filter roll-off.

In other applications, the performance of the low-order floating-point filter on the high-order linear model is checked (performance check 310). There are a number of approaches that can be used to accomplish step 310. For example, if, in a control application, a model of the disturbances to the system is included in the model and the input to the disturbance model is assumed to be unit variance white noise, then the nominal performance may be checked by computing the $H_2$ norm of the closed-loop system with the disturbance as its only input and the error signal as its only output. In this case, the performance measure is the RMS value of the error signal.

Alternatively, as part of performance check 310, the worst-case performance may be computed using model uncertainties. An example of the use of model uncertainties may be found in U.S. patent application Ser. No. 09/345, 640, filed Jun. 30, 1999, entitled "Model Error Bounds for Identification of Stochastic Models for Control Design", to Sunil Shah, and assigned to the assignee herein. By searching for the maximum structured singular value of the uncertain closed-loop system at each frequency of interest, a worst-case disturbance to error signal gain versus frequency plot may be generated. The worst-case $H_2$ norm of the uncertain system, under the assumptions made above on the disturbance model, may then be computed by normalizing the integral of the area under the worst-case gain plot (using Parseval's Theorem).

In yet another approach to performance check 310, the peak structured singular value across all frequencies of interest of the frequency weighted uncertain closed-loop system from all disturbances and references to all error signals of interest may be computed as the performance measure. This analysis is referred to as mu-analysis and the peak structured singular value is referred to as mu ($\mu$).

Alternatively, the performance check 310 may be performed using a Monte Carlo simulation where the initial conditions and plant perturbations are chosen randomly.

If the performance of the low-order filter on the high-order linear model is unacceptable, then the filter reduction (235) or the filter design (210 or 225) must be repeated.

Continuing with reference to FIG. 3, an alternative embodiment for implementation of block 300 includes testing the performance of the low-order floating-point filter on the full nonlinear model of the system (performance check 320). The full nonlinear model may include the high-order linear model, nonlinear effects such as friction and saturation as well as time-varying disturbances may also be grouped nonlinear model. If the performance of the low-order filter on the full nonlinear model is unacceptable (i.e., following the completion of performance check 320), then filter reduction (235) and/or the filter design (210 or 225) must be repeated.

Block 400—Floating-Point to Fixed-Point Filter Conversion

With reference to FIG. 3, the structure of the Floating-Point to Fixed-Point Filter Conversion block 400, which includes 410, 420, 430, and 440 is discussed. After a filter implementation structure 410 is selected, a check on the appropriateness of the structure is performed 420. Coefficient and signal scalings are then initialized 430 and adjusted 440.

Continuing with reference to FIG. 3, if the performance of the low-order floating-point filter on the high order linear model (following completion of performance check 310) or if the low-order floating-point filter on the full nonlinear model (following completion of performance check 320) is acceptable, then the coefficients of the filter are mapped to the coefficients of a floating-point implementation structure 410.

It should be noted that as part of implementation structure 410, the stable part of the filter may be implemented as a cascade biquad filter (i.e., a second-order filter), a parallel biquad filter, a lattice filter, or a direct form IIR filter. Alternatively, the filter may be implemented using third-, fourth-, or higher-order filter sections. For a multi-input multi-output (MIMO) controller, the filter implementation 410 selected may be an efficient state-space structure, where the system matrix is in, for example, a Jordan, Schur, or companion form.

Real-time implementation of filters on fixed-point processors requires careful attention to choice of structure and scaling of filter coefficients. The final implementation requires a trade-off between desired precision of the coefficients (as they are represented in integer form) and the signal levels occurring in the filter. Signal levels and coefficient precision are often competing requirements and the final implementation requires a design balance between them.

During mapping of the implementation structure 410, the coefficients are mapped using techniques that minimize either the probability of signal saturation or the effects of quantization. For most filter implementation structures 410, such as cascade and parallel biquad filters, the method of this invention uses techniques that are well known in the art of signal processing filter design.

The selection of the filter structure for the stable filter may be a decision that the user makes or a computerized Real-Time Planner for Design (previously discussed) may be used to provide assistance.

Alternatively, the method might be configured so that the Real-Time Planner for Design makes the decision automatically. Filter implementation resources include the microprocessor computation time available between interrupts and are subject to the memory limitations of the system. Given these limits, a set of costs for these resources and a set of costs for going from a floating-point version of a particular implementation structure to a fixed-point version of an implementation structure, the Real-Time Planner for Design can use Bayesian networks to guide the user in choosing an implementation structure 410. The Real-Time Planner for Design may be used to assist or make other decisions throughout the method shown in FIG. 3 by using information about the costs for each decision. Examples of some of the potential decisions and costs for each block associated with FIG. 3 are outlined in the table of FIG. 4.

Continuing with FIG. 3, if an unstable filter is part of the filter implementation structure 410, the unstable filter may be implemented using an anti-windup technique in which saturation limits are imposed on the feedback signals. By applying saturation limits to feedback signals within the filter, the filter avoids computing outputs based on values exceeding the saturation limits. Without this feature, the filter may compute a series of incorrect values and may possibly go unstable due to nonlinear effects such as limit cycles when the input to the filter becomes sufficiently large.

Referring to FIG. 3, after a filter implementation structure 410 is selected a check on the appropriateness of the structure may optionally be performed (420), as discussed in further detail below. Initial implementation parameters 430 are chosen (i.e., coefficient and signal scalings are initialized). The following paragraphs briefly describe coefficient and signal scalings.

Scalings are divided into two categories: coefficient scalings and signal scalings. Coefficient scalings are defined as scalings that are absorbed through multiplication into existing coefficients to create scaled coefficients. Hence, coefficient scalings do not change the number of operations, such as multiplications or bitshifts, required to implement a filter.

Signal scalings are defined as scalings that require an increase in the number of operations in order to implement a filter. As an example, consider the case when a signal needs to be increased in size before a series of computations in order to decrease quantization effects. In this case an extra multiplication could be used to increase the signal size. The extra multiplier is the signal scaling. As another example, suppose a 32 bit signal needs to be reduced in size so that it can be saved as a 16 bit signal. A right bitshift of 10 bits can be used to reduce the size of the signal. The right bitshift of 10 bits, which is equivalent to division by $2^{10}$, is the signal scaling factor. Scalings that are powers of 2 are usually chosen so that scaling can be accomplished efficiently using left and right bitshifts, instead of through the introduction of extra multiplications. For example, if a coefficient is 1.97263, and the word length is 8 bits (with the eighth bit being a sign bit), then choosing a scaling of $2^{-6}$ yields the maximum resolution. This is because seven bits are used to store the magnitude of the number and $2^7 * 2^{-6} = 2$, which is greater than the coefficient. In this case, the coefficient quantization level is $2^{-6} = 0.015625$.

Continuing with reference to FIG. 3, once an implementation structure 410 has been chosen a partial check 420 of the appropriateness of the implementation structure may optionally be performed. Partial check 420 analyzes the effects of coefficient quantization on the floating-point implementation. If it is decided by either the user, the software implementation of the method, or a Real-Time Planner for Design, that the filter cannot be represented accurately enough by the filter implementation structure 410 then another filter implementation structure must be chosen.

In one embodiment of partial check 420, the coefficients may first be quantized so as to retain the highest resolution possible given the word length of the target hardware. The appropriateness of the implementation structure is then checked by comparing the frequency response of the original floating-point controller design and the frequency response of the implementation structure with quantized coefficients. For example, in one embodiment of the present invention this comparison is made and then presented to the user with a visual comparison. If the comparison shows that the effects of coefficient quantization are large for the chosen implementation structure, then a new implementation structure must be chosen.

In another embodiment, as part of partial check 420, a quantitative comparison may be done by computing the integral of the relative error between the frequency responses. In yet another embodiment of performing partial check 420, the two filters may be put into state space form and the Hankel norm of the difference of the two filters may be computed. In still another embodiment, a comparison between the worst-case performances (worst-case closed-loop performance for a controller) in the face of model uncertainties (as described above) may also be included as part of partial check 420. As before, if the comparison shows that the effects of coefficient quantization are large for the chosen implementation structure, then a new implementation structure must be chosen.

Continuing with reference to FIG. 3, if the effects of coefficient quantization are small for the chosen implementation structure, then the initial implementation parameters 430 are selected. The implementation parameters include the coefficient scalings, the signal scalings, and/or the saturation limits for the unstable filter.

In one embodiment, a software implementation of the method presents the user with trade-offs between quantization levels and real-time resource usage. As part of this embodiment and in order to minimize quantization effects, all the coefficient and signal scalings may be chosen independently at the time the initial implementation parameters 430 are chosen. The software needed to implement the filter on the target hardware for such an embodiment requires more memory and significantly more computational time.

When choosing the initial implementation parameters 430, the user may also specify a number of scalings and then have the software automatically determine how to best distribute the scalings. The initial coefficient scalings could be selected as the coefficient scalings used during partial check 420.

It should be noted that quantization effects may also be minimized subject to the constraint that all coefficients and signals have the same scaling. In this case, the software implementing the filter on the target hardware may be much more efficient; however, the quantization effects may be severe. One embodiment of the present invention allows the user to group coefficients and/or signals that share the same scalings. Thus, this emobodiment improves efficiency while at the same time limiting quantization effects.

In an alternate embodiment, the coefficient scalings may be grouped such that the scaling for the group is selected as the smallest scaling of the group. This embodiment ensures that all coefficients in the group can be represented. In yet another embodiment, the coefficient scalings are chosen so as to constrain the poles and zeros of the filter with quantized coefficients to remain within disks about the poles and zeros of the original filter. The radii of the disks could be specified by the user or with guidance from a real-time planner for design.

It should be noted that, as stated above, the coefficient scalings may be grouped for implementation efficiency at the expense of increased coefficient quantization levels. It should also be noted that the signal scalings may be chosen using initial estimations. Additionally, it should be noted that the signal scalings may be obtained by any techniques known in the art, such as by recording the maximum signal values at each node during a closed-loop floating-point simulation including the disturbance model.

Block 500—Fixed-Point Performance Checks

Referring to the flowchart in FIG. 3, once the initial implementation parameters 430 have been selected, performance checks 510 and 520 are performed. Performance checks 510 and 520 are similar to performance checks 310 and 320 with the exception that performance checks 510 and 520 use the fixed-point implementation structure for the filter. As with performance checks 310 and 320, performance checks 510 and 520 may include results from Monte Carlo simulations and/or may include analyses of the transfer functions within the fixed-point controller implementation. If the closed-loop performance using the fixed-point controller is found to be unacceptable, or if any simulated signals saturate, then the implementation parameters may be adjusted 440.

Performance checks 510 and 520 may also use simulations or experiments that include the target hardware. As an example, a floating-point, possibly nonlinear, simulation of the system to be controlled may be run on a host computer, while the fixed-point controller implementation may be run on a digital signal processor (DSP). The floating-point part of the simulation may be run from within a real-time planner for design, which could then communicate with the DSP or the DSP development environment through, for example, memory addresses, data buses, communication ports, or files. The simulation could involve communication between the host computer and the DSP for every sample time during the simulation.

The use of fixed-point simulations in performance checks 510 and 520 can significantly shorten development cycle times by allowing the development of fixed-point filter design before the target hardware is available. Development cycle times can also be shortened using fixed-point simulations because a long time is typically required to setup or modify the target hardware and fixed-point filter implementation. In addition, the fixed-point filter implementation may be downloaded to the target processor when the hardware is ready and actual experiments may be conducted on the target system. The automation of this step may greatly decrease the time needed to implement and refine a fixed-point filter implementation.

Development cycle times may be further decreased by allowing fixed-point simulations or experiments using the target hardware from within the software implementation of the fixed-point filter design method. Since it may take more time to complete a simulation than an actual experiment, there may be times when it is preferable to conduct a series of tests on the actual system rather than simulating a model of the system. The information downloaded to the target hardware may be the output of compiling and linking automatically generated code. The code may include combined software modules for different components of the implementation. In addition, skeleton code and linking instructions providing the correct interface to existing code on the target hardware may be generated according to specifications input by the user. Alternatively, the fixed-point implementation that is downloaded to the target hardware may include data containing the coefficients and generic library modules that are linked together to form the filter implementation.

The signal scalings may be adjusted, as part of 440 in an iterative manner using information from fixed-point simulations. Since the signal scalings are chosen to minimize signal quantization while minimizing the probability of signal saturation, allowing for more signal quantization will reduce the probability of signal saturation.

One method of adjusting signal scalings is to observe the signals, record when they saturate, and then decrease the signal scalings of the saturating signals. This may be an iterative method in which the signal scaling of the signal that saturates first is adjusted first. If a signal saturates, then the signal scaling corresponding to the signal that saturated may be reduced by a power of 2. If signal saturation does not occur, then all of the signal scalings may be increased by a power of 2 so as to decrease the signal quantization.

If decreasing the signal scaling does not prevent saturation before the signal quantization becomes too severe, an alternative solution may then be used to decrease the coefficient scalings. Decreasing the coefficient scalings also decreases the signal sizes, but at the expense of the accuracy of the filter implementation instead of at the expense of the signal quantization level. If adjusting the implementation parameters does not improve the closed-loop performance, then controller reduction 235 or design blocks 210 or 225 may be repeated.

Alternatively, adjusting the coefficient and signal scalings 440 may be performed using any commercially available scaling software package. In this approach, after the initialization of the parameter settings 430 is completed, an implementation of the controller or filter written in the C programming language can be simulated with a model of the physical plant within the commercially available scaling software package environment. As the simulation proceeds, the commercially available scaling software package program records the statistics for a set of selected variables, known as annotated variables, and uses these statistics to generate recommended settings for the coefficient and signal scalings. These recommended scalings can then be rechecked against performance metrics, during performance check 510.

As another alternative, if the system disturbance can be adequately modeled as a stochastic process, then the mapping of the adjusted controller coefficients 440 to the coefficients of the implementation structure may be accomplished using a technique known as stochastic scaling. For a given controller structure (e.g., cascade biquad or state-space), this method minimizes the probability of saturation occurring in the controller by equalizing the signal (variance) level at each critical controller node. The scaling parameters, given by the solution to a steady state Lyapunov equation, may be combined with coefficient resolution requirements for closed loop stability to form an automated method for fixed-point scaling. In particular, stochastic scaling is used to make all of the signal sizes roughly equal in size. This approach makes the effects of adjusting the coefficient and signal scalings by the same amounts very predictable. Hence, stochastic scaling may be very useful for reducing the number of iterations needed to arrive at a fixed-point controller implementation.

It should be noted that the present invention applies to the subset of filters known as feedback controllers as well as any filters commonly used in signal processing applications, such as equalizers, estimators, and bandpass filters (including lowpass, highpass, and bandstop filters).

It should be noted that the present invention may be included as part of a software tool for integrating and automating the process of implementing a fixed-point filter design. The software implementation of the present invention may be in a graphical user interface (GUI) type environment, in an embedded configuration or in any other type of environment known in the computer processing arts. The process may be managed by a real-time planner for design that is capable of making suggestions or decisions based on a priori probabilities, a posteriori probabilities, costs of outcomes, or a combination thereof. The real-time planner may automatically make many decisions, while the user may make other decisions with guidance provided by the planner.

Thus, a method and system for design and implementation of fixed-point filters for control and signal processing have been described. Although specific embodiments, including specific equipment, parameters, methods, and algorithms have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method comprising:

selecting a design sequence for designing a fixed-point filter for a system;

selecting a low-order floating-point filter;

selecting a first set of parameters associated with said low-order floating-point filter; and modifying at least one parameter of said first set of parameters to obtain a set of modified parameters, until a plurality of performance characteristics calculated using said first set of parameters meets a performance objective for said fixed-point filter for said system.

2. The method according to claim 1, wherein modifying said at least one parameter of said first set of parameters further comprises:

selecting a set of initial values for said at least one parameter of said first set of parameters;

computing said at least one low-order floating-point filter component for said set of initial values; and evaluating a plurality of initial performance characteristics calculated for said set of initial values.

3. The method according to claim 2, wherein modifying said at least one parameter of said first set of parameters further comprises:

displaying said set of initial values for said at least one parameter of said first set of parameters and said plurality of initial performance characteristics in a graphical user interface.

4. The method according to claim 3, wherein modifying said at least one parameter of said first set of parameters further comprises entering a numerical value for said at least one parameter of said first set of parameters in said user interface, until said plurality of initial performance characteristics meets said performance objective.

5. The method according to claim 2, wherein modifying said at least one parameter of said first set of parameters further comprises:

selecting a plurality of parameter values for each parameter of said first set of parameters;

selecting a new parameter value in said plurality of parameter values for said at least one parameter of said first set of parameters to obtain a set of modified parameters;

computing said at least one low-order floating-point filter component for said set of modified parameters;

evaluating a plurality of modified performance characteristics calculated for said set of modified parameters; and comparing said plurality of modified performance characteristics to said plurality of initial performance characteristics.

6. The method according to claim 5, wherein modifying said at least one parameter of said first set of parameters further comprises replacing said set of initial values of said first set of parameters with said modified parameter values if said plurality of modified performance characteristics is closer to said performance objective than said plurality of initial performance characteristics.

7. A computer readable medium containing executable instructions which, when executed in a processing system, cause said system to perform a method comprising:

selecting a design sequence for designing a fixed-point filter for a system;

selecting a low-order floating-point filter;

selecting a first set of parameters associated with said low-order floating-point filter; and modifying at least one parameter of said first set of parameters to obtain a set of modified parameters, until a plurality of performance characteristics calculated using said first set of parameters meets a performance objective for said fixed-point filter for said system.

8. The computer readable medium according to claim 7, wherein modifying said at least one parameter of said first set of parameters further comprises:

selecting a set of initial values for said at least one parameter of said first set of parameters;

computing said at least one low-order floating-point filter component for said set of initial values; and evaluating a plurality of initial performance characteristics calculated for said set of initial values.

9. The computer readable medium according to claim 8, wherein modifying said at least one parameter of said first set of parameters further comprises:

displaying said set of initial values for said at least one parameter of said first set of parameters and said plurality of initial performance characteristics in a graphical user interface.

10. The computer readable medium according to claim 9, wherein modifying said at least one parameter of said first set of parameters further comprises entering a numerical value for said at least one parameter of said first set of parameters in said user interface, until said plurality of initial performance characteristics meets said performance objective.

11. The computer readable medium according to claim 8, wherein modifying said at least one parameter of said first set of parameters further comprises:

selecting a plurality of parameter values for each parameter of said first set of parameters;

selecting a new parameter value in said plurality of parameter values for said at least one parameter of said first set of parameters to obtain a set of modified parameters;

computing said at least one low-order floating-point filter component for said set of modified parameters;

evaluating a plurality of modified performance characteristics calculated for said set of modified parameters; and comparing said plurality of modified performance characteristics to said plurality of initial performance characteristics.

12. The computer readable medium according to claim 11, wherein modifying said at least one parameter of said first set of parameters further comprises replacing said set of initial values of said first set of parameters with said modified parameter values if said plurality of modified performance characteristics is closer to said performance objective than said plurality of initial performance characteristics.

* * * * *